United States Patent
Knox

Patent Number: 6,139,053
Date of Patent: Oct. 31, 2000

[54] SINGLE POINT ACCELERATION SENSOR

[75] Inventor: Matthew J. Knox, Romulus, Mich.

[73] Assignee: Autoliv ASP, Inc., Ogden, Utah

[21] Appl. No.: 09/059,946

[22] Filed: Apr. 14, 1998

[51] Int. Cl.$^7$ .................................................. B60R 21/32
[52] U.S. Cl. ........................... 280/735; 200/61.45 R
[58] Field of Search .................................. 280/734, 735, 280/806; 180/28; 200/61.45 R

[56] References Cited

U.S. PATENT DOCUMENTS

| | | | |
|---|---|---|---|
| 3,911,391 | 10/1975 | Held et al. | 340/52 H |
| 3,981,518 | 9/1976 | Pulling | 280/730 |
| 4,097,699 | 6/1978 | Larson | 200/61.45 R |
| 4,243,971 | 1/1981 | Suchowerskyj et al. | 340/52 H |
| 4,329,549 | 5/1982 | Breed | 200/61.45 M |
| 4,410,875 | 10/1983 | Spies et al. | 340/52 H |
| 4,484,041 | 11/1984 | Andres et al. | 200/61.45 M |
| 4,608,501 | 8/1986 | Andres et al. | 307/105 B |
| 4,638,179 | 1/1987 | Mattes et al. | 307/10 SB |
| 4,639,563 | 1/1987 | Gunther | 200/61.45 M |
| 4,827,091 | 5/1989 | Behr | 200/61.45 M |
| 4,889,068 | 12/1989 | Tabata et al. | 116/203 |
| 4,915,411 | 4/1990 | Norton | 280/734 |
| 4,955,638 | 9/1990 | Kinoshita et al. | 280/806 |
| 4,985,835 | 1/1991 | Sterier et al. | 364/424.05 |
| 5,005,861 | 4/1991 | Breed et al. | 280/734 |
| 5,011,182 | 4/1991 | Husby et al. | 280/735 |
| 5,100,169 | 3/1992 | Goor et al. | 280/733 |
| 5,177,370 | 1/1993 | Meister | 307/10.1 |
| 5,184,844 | 2/1993 | Goor | 280/733 |
| 5,261,506 | 11/1993 | Jost | 180/282 |
| 5,375,908 | 12/1994 | Goor | 297/216.11 |
| 5,390,952 | 2/1995 | Goor | 280/730 R |
| 5,430,334 | 7/1995 | Meister | 307/10.1 |
| 5,449,198 | 9/1995 | Jeenicke et al. | 280/735 |
| 5,485,041 | 1/1996 | Meister | 307/10.1 |
| 5,620,203 | 4/1997 | Jeenicke et al. | 280/735 |
| 5,706,181 | 1/1998 | Dirmeyer et al. | 361/804 |
| 5,895,071 | 4/1999 | Norton | 280/735 |

*Primary Examiner*—Paul N. Dickson
*Assistant Examiner*—Faye M. Fleming
*Attorney, Agent, or Firm*—Sally J. Brown

[57] ABSTRACT

A sensor designed and adapted to operate with vehicle restraints whose primary purpose is to sense low "g" accelerations and vehicle tilting, the results of which lead to the activation or deactivation of the primary occupant restraints through a control module. This invention specifically addresses the reliability of vehicle acceleration and tilt sensors. By employing fewer numbers of components and by having a fewer number of failure mechanisms this invention provides a sensor of increased reliability and lower manufacturing cost. Furthermore, this sensor invention restrains effect z-axis accelerations often encountered when a vehicle is merely traveling over rough roads. This invention employs innovative detector technology, alternatively using an IR detector or a Hall Effect Device detector.

21 Claims, 9 Drawing Sheets

SINGLE POINT ACCELERATION SENSOR

BACKGROUND OF THE INVENTION

1. Field of the Invention

This invention relates to automobile passenger restraints. More specifically, this invention relates to sensors for detecting low "g" accelerations and vehicle tilting for the purpose of activating or deactivating the primary automobile occupant restraint.

2. Description of Related Art

Automobile occupant restraints, including seat belts, airbags and belt tensioners, are important components of an automobile occupant safety system. It is essential, for the best performance of the restraint, to determine when vehicle acceleration or tilt exceeds a specified value. The acceleration or degree of tilt can indicate a collision or the existence of highly sloped terrain. Indications from such a sensor as this invention can be used to trigger an airbag or the tensioning of belt restraints.

A variety of tilt or acceleration sensors have been developed and are widely used in vehicles. A typical sensor for this application uses a mass known as the "standing man" which works with an optical pair. When the mass senses accelerations or tilt greater than a specified parameter, it tilts. This tilting lifts a leaver which then causes a break in the optical beam resulting in the activation or deactivation of the occupant restraint by a control module. Typically, such sensors have a relatively large number of supporting components and potential failure mechanisms. Such sensors require a relatively large amount of hands on assembly effort and associated quality checks.

A second type of sensor known in the industry is commonly referred to as a "Schmidt" sensor. This sensor is essentially the same as the previously described sensor, but has its components scaled down and placed in a single final assembly. While the same number of failure mechanisms are present, the assembly time and effort is improved from the typical sensor. Unfortunately, the manufacturing cost of the "Schmidt" sensor is much higher than the typical sensor.

Alternative sensors use displaceable bars or pivoting arms abutting against inertia bodies and operated by the movements of the bodies. It is also well known to use light rays or radiation from other radiating sources to sense or detect the position or movements of inertia bodies in locking devices for vehicle safety belts. It is particularly known to use light rays that can be reflected by a surface of an inertia body, for example a pendulum, where the reflected light rays being detected by a light sensitive means. When the inertia body changes position, the output from the light sensitive means is changed and this output is used as a control for the occupant restraint. One disadvantage of this type of sensing device is that to provide reliable operation the light radiating means and the light detecting means must be positioned with a high degree of accuracy in relation to the reflecting surface of the inertia body. Such accuracy is particularly difficult to achieve, when the inertia body is a standing, tiltable inertia means.

An alternative inertia member used to isolate the electric circuits of a motor vehicle in the event of an impact, is a double supported apertured pendulum member, which maintains a horizontal position as it swings, and which intercepts a light beam between a light source and a light sensor. The light beam normally passes through the aperture in the pendulum member. The light beam radiation received by a detector, through the aperture in the pendulum, provides an indication of the position of the inertia body.

Other safety system triggering or sensing apparatuses used for the protection of motor vehicle occupants include: a system employing a two sensors, one oriented substantially parallel to the forward direction of motion of the vehicle and a second oriented at an angle relative to the first axis, where the acceleration signals generated by the sensors are evaluated using digital and analog processors; an acceleration sensor that includes a permanent magnet mounted for movement within a cylindrical cavity in a body of non-magnetic material, where acceleration forces on the magnet move the magnet toward one of the ends of the cavity, results in a change in electrical conductance between electrical contacts within the cavity; an impact sensor including a permanent magnet disposed within a cavity and biased by magnetic force toward one end of the cavity, where the motion of the magnet in the cavity is sensed by a Weigan wire or Hall sensor; a sensor arrangement which responds to a longitudinal and/or transverse acceleration of the motor vehicle and which is configured to recognize a near weightless state of the vehicle as when the vehicle moves in a manner similar to free fall; an acceleration sensor that comprises a body of non-magnetic construction having a linear internal cavity of uniform cross section and a pair of permanent magnets movably mounted within the cavity, such that the magnets are urged to opposite ends of the cavity by the force of magnetic repulsion, where the sensor generates an output signal responsive to acceleration forces on either of the magnets which are sufficient to overcome the force of magnetic repulsion; a deceleration sensor comprising a sensor mass, a spring-loaded firing pin received in a guide bore, a trigger level for engaging the firing pin in a dormant sate until the trigger level is disengaged from the sensor mass as a result of the occurrence of a deceleration in excess of the threshold level and the resulting inertia motion of the sensor mass; and a deceleration sensor comprising a pair of sensor masses in the form of pendulums, a spring-loaded firing pin and a pair of trigger levels; a sensor having a gas-filled sealed tube having an inertial mass disposed in a closely fitting manner forming an annular orifice between the mass and the tube, where the mass is pre-loaded and biased and, upon the tube experiencing a level of velocity change above a predetermined amount, movement of the mass in the tube to activate the set of electrical contacts is damped by a viscous laminar flow of the gas through the annual orifice.

For general background material, the reader is directed to U.S. Pat. Nos. 3,981,518, 3,981,520, 4,097,699, 4,889,068, 4,955,638, 4,985,835, 5,132,662, 5,177,370, 5,261,506, 5,430,334, 5,449,198, 5,485,041, 5,620,203, and European Patent Application 0,179,120, each of which is hereby incorporated by reference in its entirety for the material disclosed therein.

SUMMARY OF THE INVENTION

It is desirable to provide a sensor, for the detection of low "g" accelerations and vehicle tilting that can be used to activate or de-activate the primary occupant restraints, with improved reliability, decreased complexity, reduced cost and increased performance.

Therefore, it is a general object of this invention to provide a sensor having fewer components and fewer potential failure mechanisms.

It is a further object of this invention to provide an acceleration sensor having a sensor ball mass, a sensor base, a sensor cover and sensor detector.

It is another object of this invention to provide an acceleration sensor which is capable of operating either with an optical detector or a magnetic field detector.

Another object of this invention is to provide an acceleration sensor which is adapted to be easily mounted on an electronic printed circuit board.

A further object of this invention is to provide an acceleration sensor which is capable of sensing tilt and/or accelerations in all directions.

These and other objectives of this invention will be readily understood by those of ordinary skill in the art upon consideration of the following detailed description, preferred embodiment, drawings and claims of the present invention. The objects of this invention are achieved by a device which comprises a sensor mass at rest on an angled sensor base within a sensor housing and a sensor which communicates with the sensor mass via a sensor aperture within the sensor base.

DETAILED DESCRIPTION OF THE INVENTION

This invention is a sensor for use in vehicles for activating and deactivating the occupant's primary restraints, such as seat belts and air bags. Specifically, this invention is adapted to sense low "g" accelerations and vehicle tilting. The preferred embodiment of this invention has four primary components and two alternative detector means. Additional alternative detectors may be employed without departing from the concept of this invention. The preferred embodiment of this invention is also adapted to be mounted on a printed circuit board, however, alternative mounting means may also be employed without departing from the concept of this invention. The preferred sensor of this invention includes a sensor mass, a detector, a sensor base and a sensor cover.

Figure 1:
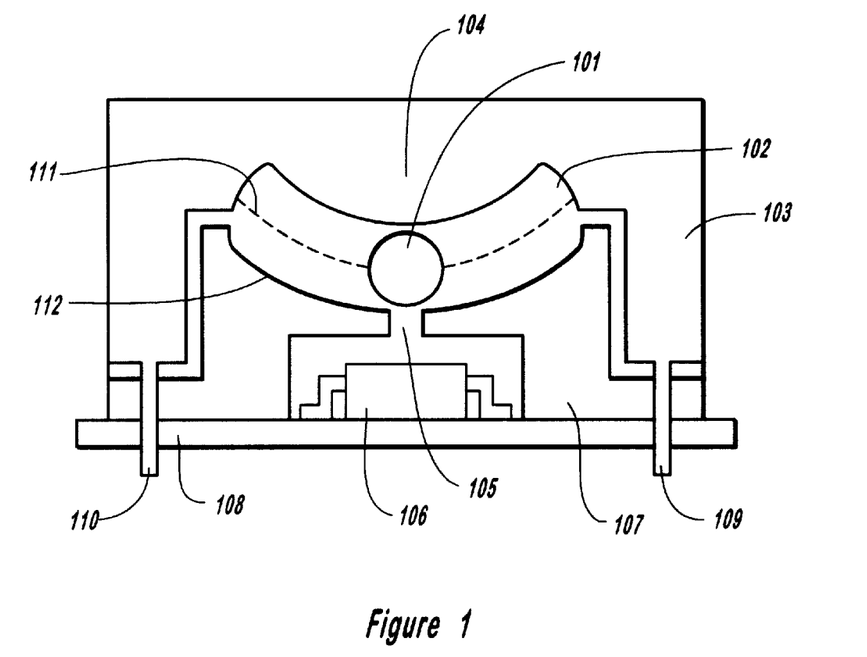
FIG. 1 shows a cross section of the preferred embodiment of the basic construction of this invention.

Referring now to FIG. 1, which depicts the cross section of the preferred embodiment of the basic construction of the invention, the sensor mass 101 is shown as a ball mass, the presently preferred ball mass has a diameter of approximately 6.35 mm and a mass of between 0.25 grams and 2 grams. Two alternative embodiments of the sensor mass 101 are used in this invention, depending on the type of detector 106 employed. In one alternative embodiment, the detector 106 is an optical detector, in which case a sensor mass 101 is coated with a high reflectivity coating, typically colored white. In a second alternative embodiment, the detector 106 uses a ferro-magnetic Hall Effect detection means and the sensor mass 101 is a ferro-magnetic mass. Further detail on the operation of each of these preferred detectors is provided below.

The sensor mass 101 rests on a sensor base 107 and is held in place by a sensor cover 103. The sensor base 107 and sensor cover 103 fit together to create a sensor cavity 102 in which a sensor mass 101 is placed. The top 112 of the sensor base 107 has a positive angle of between 10 and 20 degrees. This angle establishes the base performance of the sensor mass 101. For example, to detect 0.45 g of acceleration the desired angle is approximately 12 degrees, while to detect 0.70 g of acceleration the desired angle is approximately 15 degrees. This angle or slope in the top 112 of the sensor base 107 provides the necessary friction/opposing force for the sensor mass 101 to overcome, and to thereby provide the trigger for the sensing of the low g acceleration and or the tilting of the vehicle. An aperture 105 is provided in the optical detector embodiment of the invention to provide a path for a light beam to travel from the detector 106 to the sensor mass 101 and return to the detector 106. The preferred light beam is in the Infrared (IR) wavelength, although alternative wavelengths could be substituted. The optical detector embodiment 106 is provided with both an IR Light Emitting Diode (LED) emitter and a detector and is equipped to detect a surface, a presence and/or a transition. All three capabilities are used. When the sensor mass 101 is stationary it 101 causes the reflection of the IR light to the detector 106, which indicates to the sensor that the vehicle is not encountering significant acceleration forces or tilting. When the sensor mass 101 moves from center, directly over the aperture 105 in any combined x-y-z direction, the detector 106 senses a loss of reflectivity which indicates that the vehicle is either tilted or that it is encountering acceleration forces, typically greater than 0.45 g. When the sensor mass 101 moves from the center, over the aperture 105, the IR beam, which has an effective range of approximately 5 mm, exceeds the maximum reflection range 111 and is absorbed in the sensor cover 103. The sensor cover 103 is provided with a Z-axis restriction 104 which is adapted to permit only combined x-y-z motion of the sensor mass 101. This restriction 104 restricts or removes the possibility of single z-axis motion, which can be caused by dynamic vehicles or rough road surfaces. Sensor sensitivity is controlled by the reflectivity of the sensor mass 101, the aperture opening 105 and the distance of the sensor mass 101 from the detector 106. By increasing the aperture 105 opening, the sensitivity of the sensor is decreased. By increasing the distance between the sensor mass 101 and the detector 106 the sensitivity of the sensor is decreased. Also, by changing the pigment of the sensor mass 101 coating from white to off-white to gray also affects the sensitivity of the sensor. Typically, the preferred material for the sensor mass 101 is a solid polymer, although alternative materials can be substituted without departing from the concept of the invention. In the preferred embodiment of this invention, an aperture 105 diameter in the range of between 0.01" and 0.1" is used, although alternative diameters could be substituted without departing from the concept of this invention.

In the Hall Effect Device detector embodiment of the invention, the aperture 105 is not required. A Hall Effect detector is substituted for the optical detector 106 and the sensor mass 101 is composed of a ferro-magnetic material. The ferro-magnetic sensor mass 101 is mounted in the same manner as the optical sensor mass, that is between a sensor cover 103 and a sensor base 107. The processing of the sensor mass 101 position is performed in the same manner as the optical sensor embodiment, however, for the Hall Effect detector, the detection of the position of the sensor mass 101 is accomplished through sensing the disruption of a magnetic field. As the sensor mass 101 moves off center within the cavity 102, the Hall Effect detector 106 detects the absence or disruption in the magnetic field, thereby indicating a g force acceleration or tilt of the vehicle. Again, the z-axis restriction 104 is built into the sensor cover to prevent unwanted z-axis interference with the sensor. The preferred Hall Effect detector 106 is capable of generating the required magnetic field as well as sensing the presence or absence of the ferro-magnetic sensor mass 101.

The preferred embodiment of the sensor invention is provided with a plurality of mounts 109, 110 for fixing the sensor to a printed circuit board 108. Also, for ease of assembly and improved reliability, the sensor base 107, sensor cover 103 and sensor mass 101 are pre-assembled, in a single housing, and mounted on the printed circuit board 108. Typically, this sensor is mounted on the top of a surface mount device and is heat staked into place using the mount points 108, 110.

Important features of this invention include the ability of the sensor to detect tilt and accelerations in all directions, with a restricted z-axis capability to provide improved performance and vehicle occupant comfort; the requirements of a significantly reduced number of components and thereby a reduction in potential failure mechanisms; and simplified packaging and assembly, thereby leading to a reduction in cost and defects.

Figure 2:
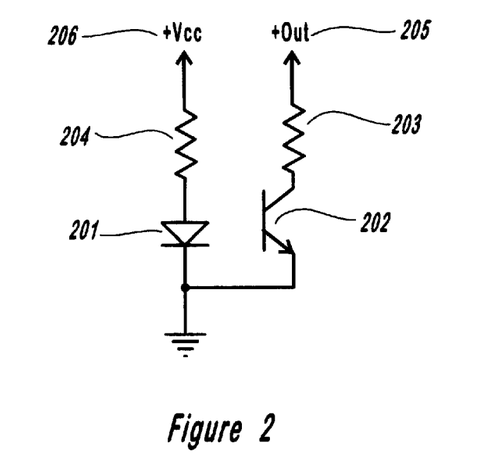
FIG. 2 shows a circuit diagram of an optical sensor as used in the preferred embodiment of this invention.

Referring now to FIG. 2, where a circuit diagram of the preferred optical sensor is shown. This circuit works in a manner similar to that of an optocoupler. The source voltage 206 and series resistor 204 produce a current through the LED 201. In turn, the light from the LED 201 is transmitted through the aperture 105, where if the sensor mass 101 is in the rest position directly over the aperture 105, the light from the LED 210 is reflected back to the detector 106 where the light hits the photo-transistor 202, setting up a current through the resistor 203 and producing an output voltage 205.

Figure 3:
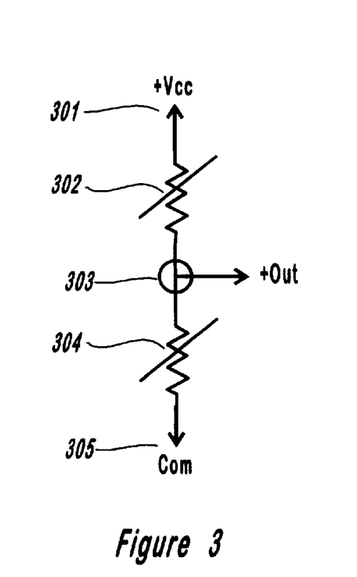
FIG. 3 shows a circuit diagram of a typical Hall sensor as can be used in an alternative embodiment of this invention.

FIG. 3 shows the circuit diagram of the preferred Hall Effect detector used in the Hall Effect detector embodiment of the sensor invention. The Hall detector functions by sensing the magnetic field applied from the +Vcc 301 to the Comm 305, across the resistors 302 and 304 producing a current and a voltage +Out 303 which is proportional to the magnetic field applied.

Figure 4:
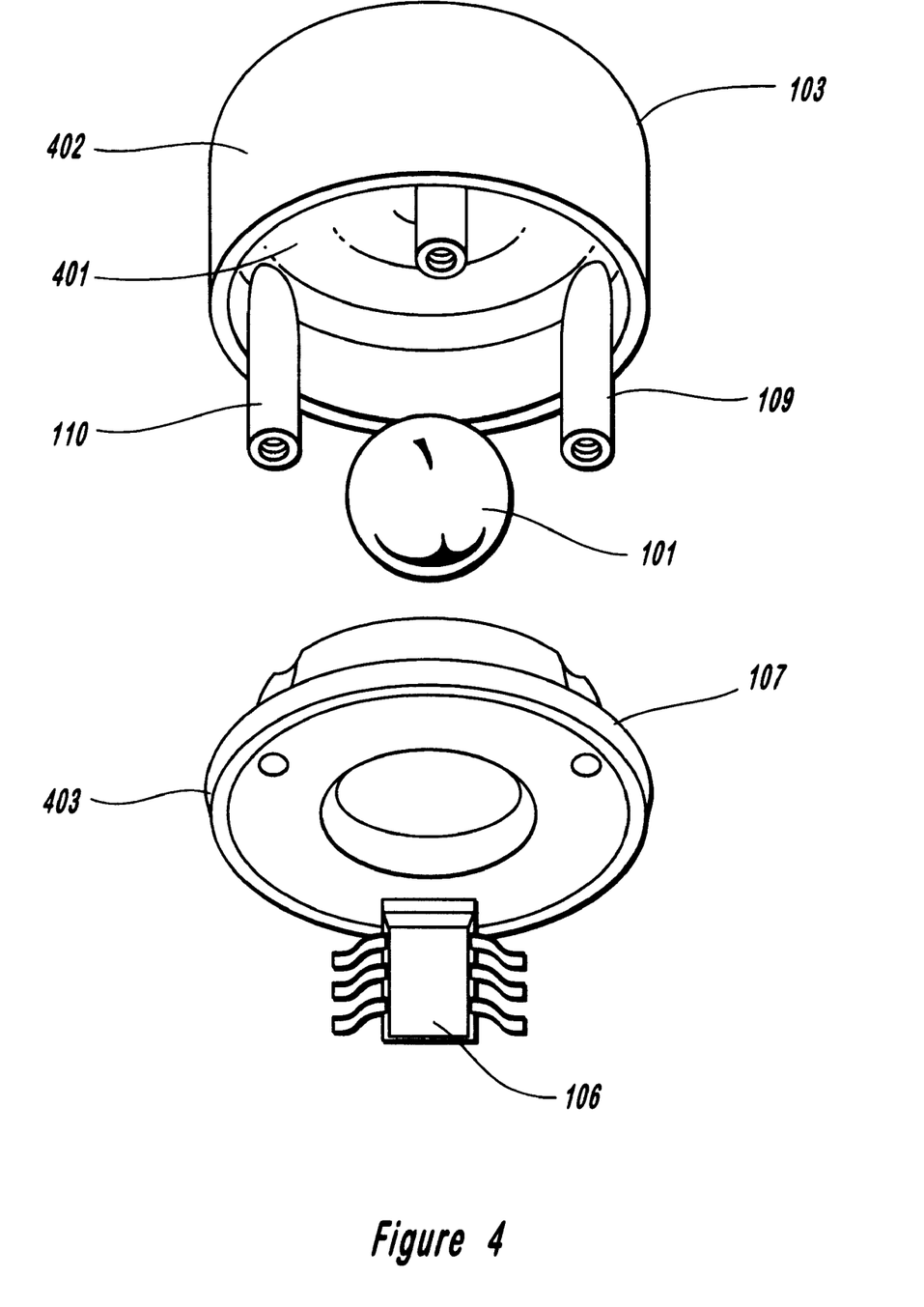
FIG. 4 shows a perspective view of the invention showing the component parts of the preferred embodiment of the invention disassembled.

FIG. 4 depicts the perspective view of the sensor invention showing the component parts of the preferred embodiment of the invention disassembled. The sensor cover 103 is shown having an internal cavity 401 for receiving the sensor mass 101. Three attachment legs are shown 109, 110, 402 for attaching the sensor to the circuit board 108. The sensor mass 101 is shown positioned so as to fit into the sensor cavity 102. The sensor base 107 is shown with the detector 106 positioned to fit within a detector cavity 403 in the bottom portion of the sensor base 107.

Figure 5:
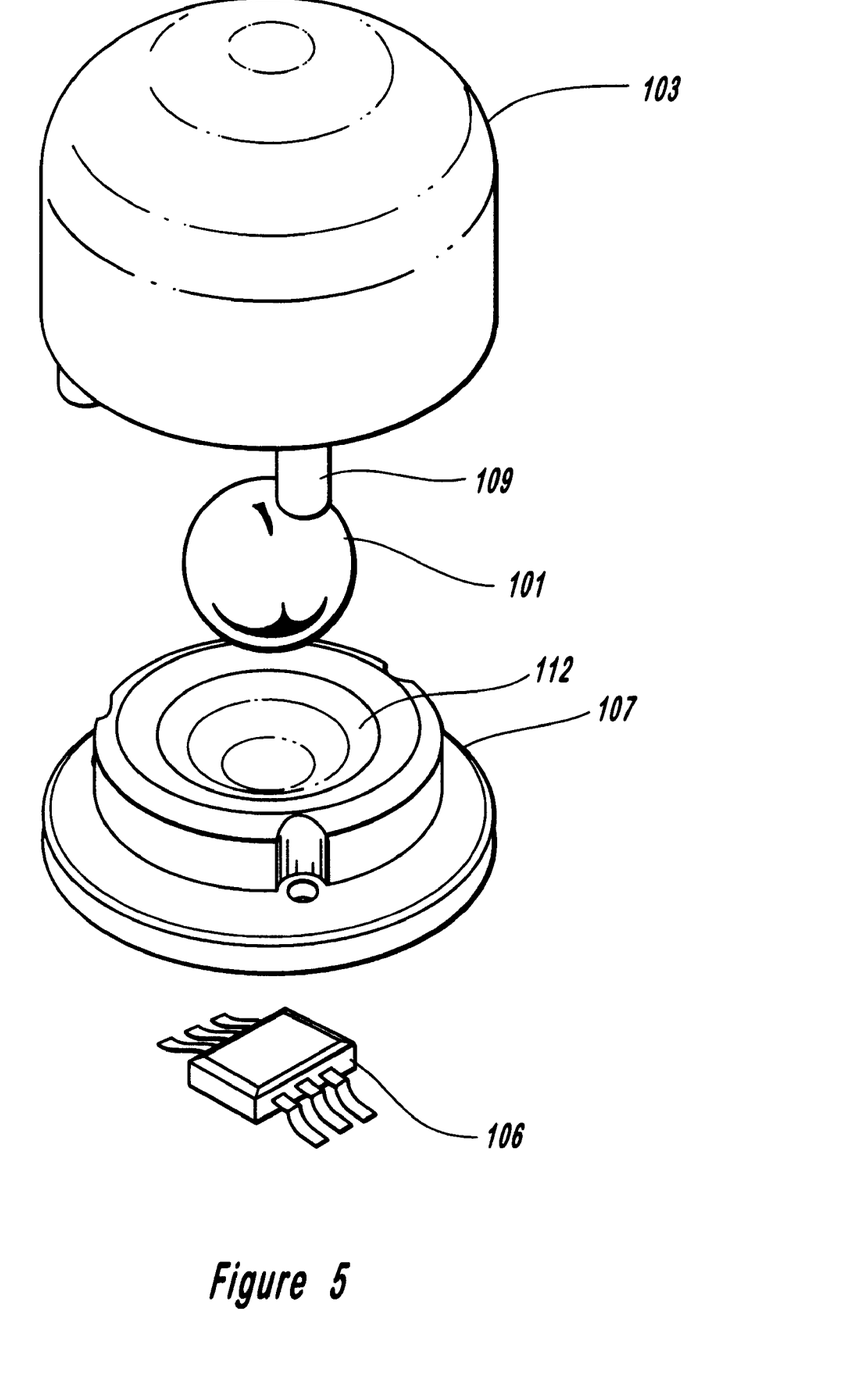
FIG. 5 shows a second perspective view of the invention showing the component parts of the preferred embodiment of the invention disassembled.

FIG. 5 depicts a second perspective view of component parts of the preferred embodiment of the invention. This view provides additional detail of the top 112 of the sensor base 107. In operation, the sensor mass 101 rests within the top 112 of the sensor base 107 with the sensor cover 103 placed over the entire device.

Figure 6:
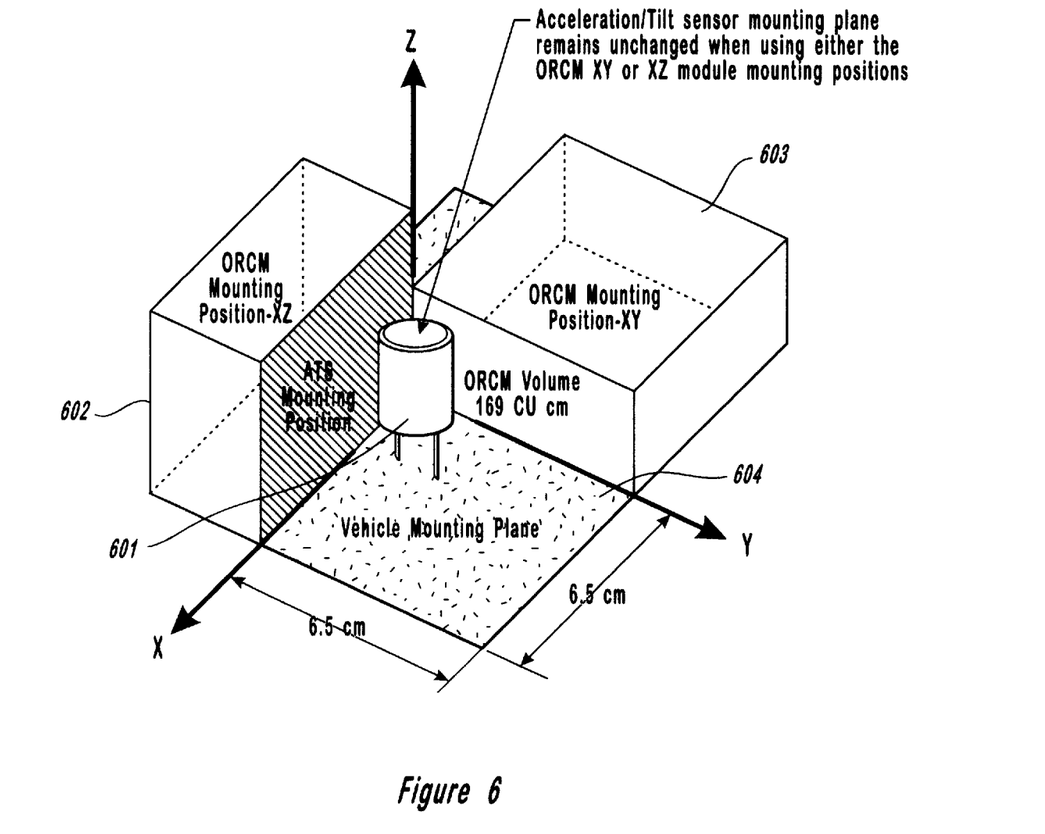
FIG. 6 shows the preferred embodiment of this invention installed in relation to the control module.

FIG. 6 depicts the preferred embodiment of the invention installed in relation to the control module (ORCM). As shown, the sensor 601 is mounted in the vehicle mounting plane 604 and can be positioned either in close proximity to a vertically mounted control module 602 or a horizontally mounted control module 603. The sensor 601 mounting plane remains unchanged when using either mounting position. Typically, both modules in the horizontal (XY) mounting position 603 and the vertical 602 mounting position have the capability of being rotated 360 degrees about the z-axis without a loss of performance.

Figure 7:
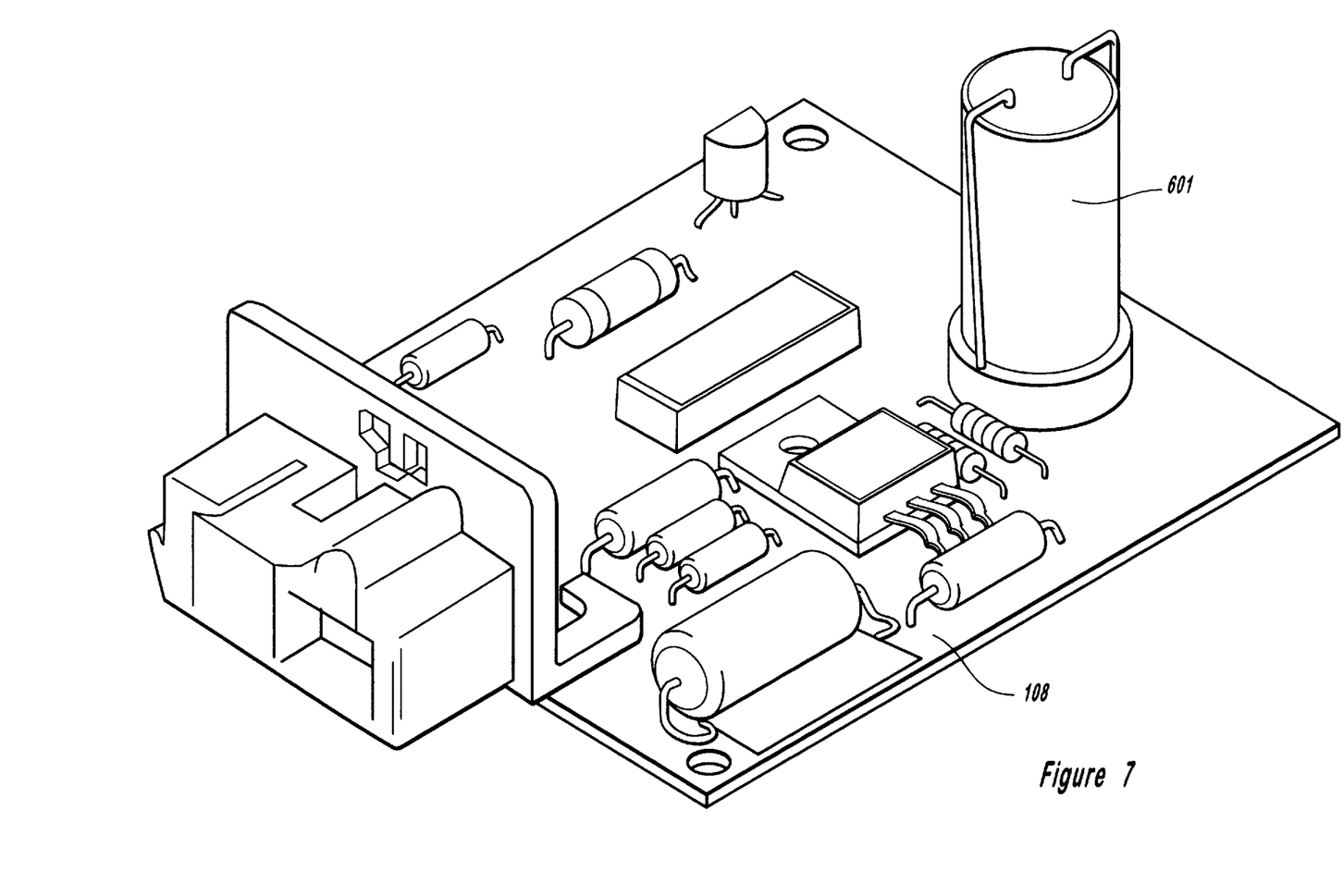
FIG. 7 shows a first alternative mounting of the invention on a through hole printed circuit board.

FIG. 7 depicts a first alternative mounting of the invention 601 on a through hole printed circuit board 108.

Figure 8:
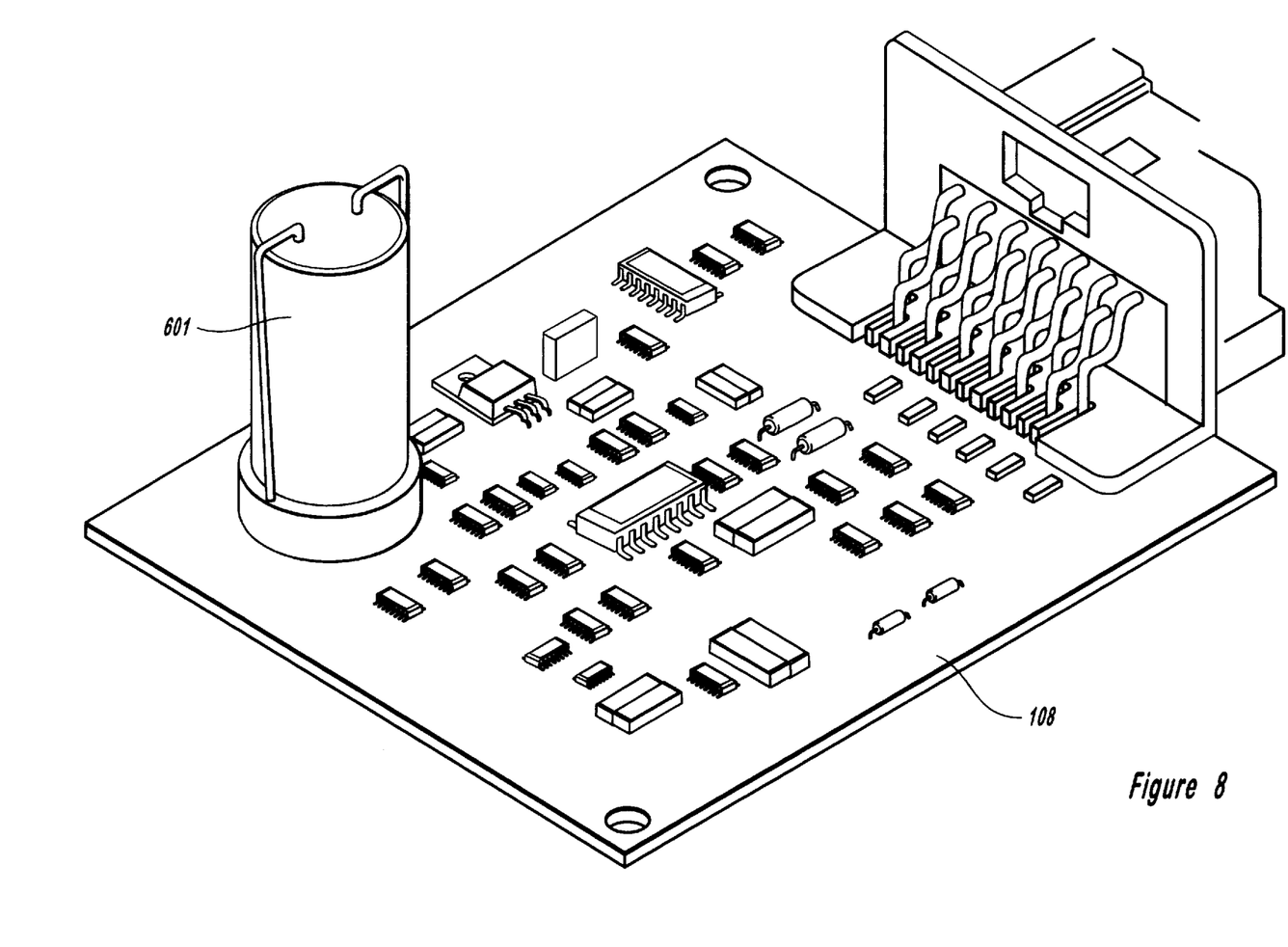
FIG. 8 shows a second alternative mounting of the invention using surface mounting on a circuit board.

FIG. 8 depicts a second alternative mounting of the invention 601 on a surface mount printed circuit board 108.

Figure 9:
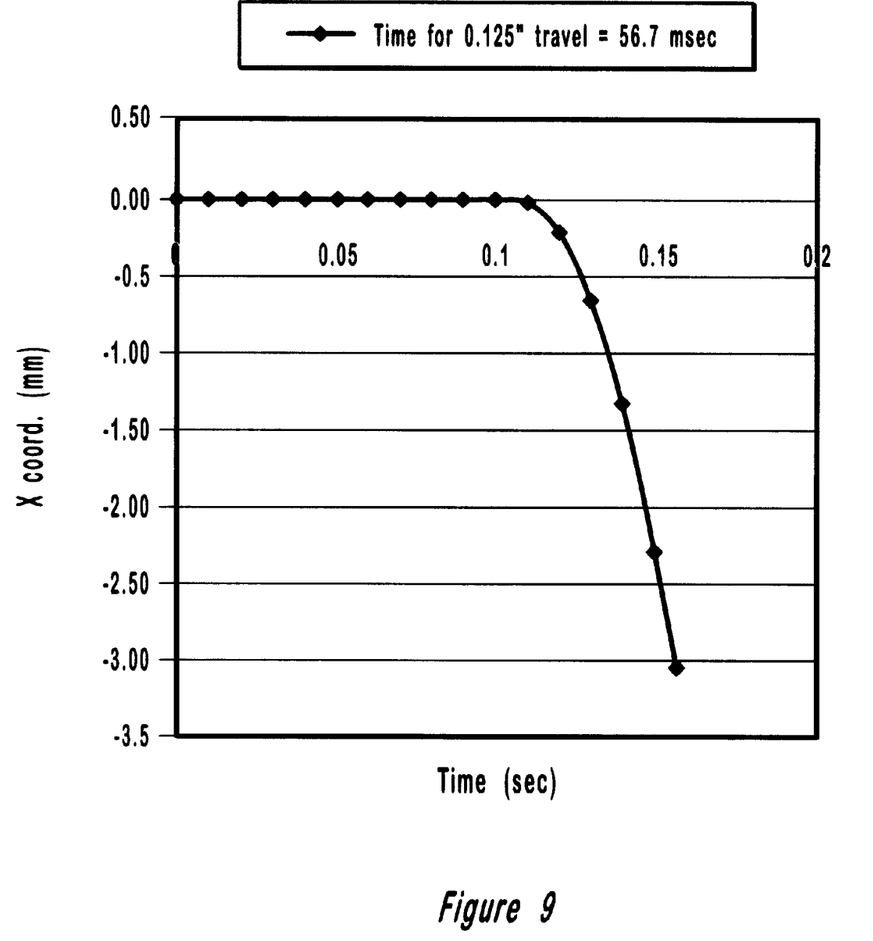
FIG. 9 shows the sensor response of the preferred embodiment of the invention at 70 g/s onset.

FIG. 9 shows a plot of the time delay between the instance of a 70 g/second acceleration and the movement of the sensor mass $\frac{1}{8}$". This plot shows that the sensor detects this change in acceleration in 0.0567 seconds.

Figure 10:
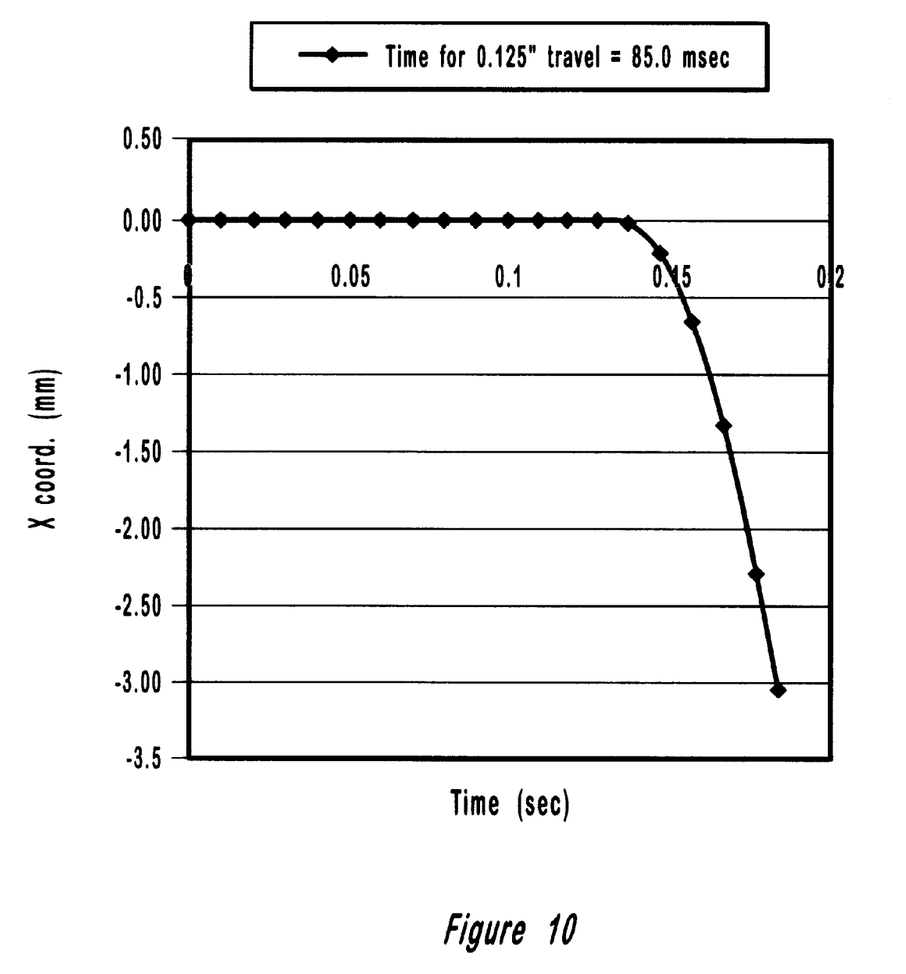
FIG. 10 shows the sensor response of the preferred embodiment of the invention at 14 g/s onset.

FIG. 10 shows a plot of the time delay between the instance of a 14 g/second acceleration and the movement of the sensor mass $\frac{1}{8}$". This plot shows that the sensor detects this change in acceleration in 0.085 seconds.

Figure 11:
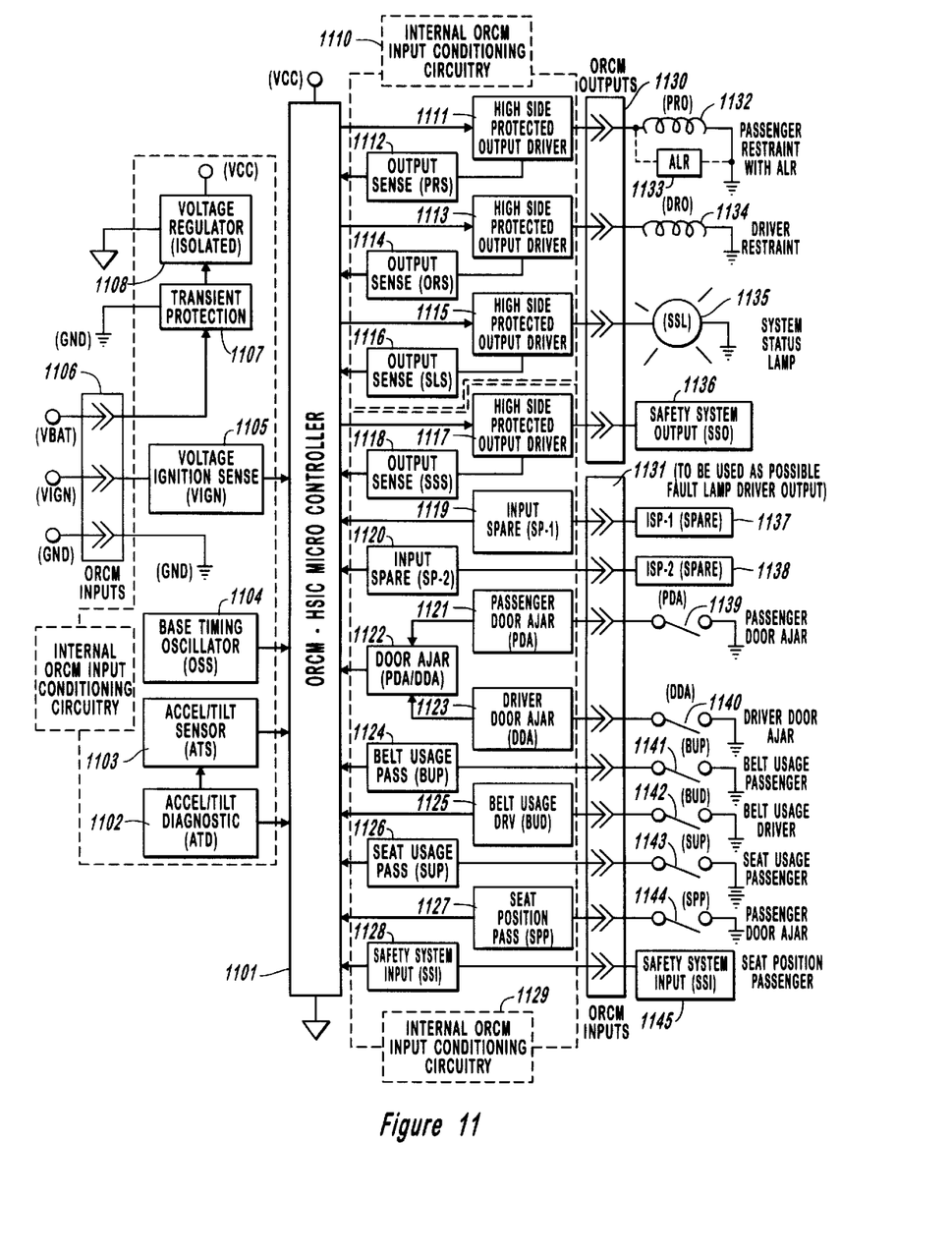
FIG. 11 shows a block diagram of the preferred embodiment of the control module system architecture used in combination with the preferred embodiment of the invention.

FIG. 11 shows the preferred control module system architecture used in combination with the sensor of this invention. This ORCM (Occupant Restraint Control Module) system provides the electronic control for the passenger restraint using the output of the sensor of this invention as a control input. A micro controller 1101 is provided to perform preprogrammed functional control for the occupant restraints.

Internal ORCM input conditioning circuitry 1109 provides power and the acceleration/tilt signals to the micro controller 1101. This internal ORCM input conditioning circuitry 1109 includes an acceleration/tilt diagnostic 1102, an acceleration/tilt sensor 1103, a base timing oscillator 1104, a voltage ignition sensor 1105, voltage transient protection 1107 and a voltage regulator 1108. ORCM inputs are connected to the ORCM via an input connector block 1106. The diagnostic for acceleration and/or vehicle tilt 1102 can be initiated by the micro controller 1101, and which provides a test input to the acceleration/vehicle tilt sensor 1103, of this invention, which in turn provides a acceleration and/or vehicle tilt input to the micro controller 1101. A voltage ignition sensor circuit 1105 is provided to sense the status of ignition power for the micro controller 1101. A base timer oscillator 1104 is provided for the creation of a system clock for the micro controller 1101. Transient power protection 1107 is provided to protect the electronic circuitry of the micro controller 1101. A voltage regulator 1108 provides vehicle battery isolation from the circuitry of the micro controller 1101.

A number of inputs are provided to the ORCM, including a passenger's door ajar status switch 1139, a driver's door ajar status switch 1140, a passenger's belt in use switch 1141, a driver's belt in use switch 1142, a passenger seat in use switch 1143 and a passenger seat position switch 1144. Also, a safety system signal input is provided 1145. Each of these inputs are provided to the ORCM through connectors 1131. Two spare input connections 1137, 1138 are also provided to permit the future expansion of the ORCM system.

Also provided is an internal ORCM input conditioning circuitry 1129, which includes two spare input conditioning circuits 1119, 1120 which receive electrical signals from the spare input connections 1137, 1138, for future expansion of the use of the control module. A passenger door ajar signal conditioning circuit 1121, which receives the status of the passenger door from the passenger door switch 1139 through the connector 1139, is provided along with a driver door ajar conditioning circuit 1123, which receives the status of the driver's door from the driver door ajar switch 1140, which together with the combination with the door ajar circuit 1122 provides vehicle door ajar status to the micro controller 1101. A passenger belt use conditioning circuit 1124 receives the passenger belt usage from the passenger belt usage switch 1141 through the connector 1131, and provides the usage status of the passenger belt to the micro controller 1101. A driver's belt usage conditioning circuit 1125 receives the drivers belt usage from the driver's belt usage switch 1142 through the connector 1131, provides the usage status of the driver's belt. A passenger seat usage conditioning circuit 1126, receives the passenger seat usage from the passenger seat usage switch 1143, and provides an indication of whether the passenger seat is occupied to the micro controller 1101. A passenger seat position conditioning circuit 1127, receives the passenger seat position from the passenger seat position switch 1144, and provides the passenger's seat position status to the micro controller 1127. A safety system input conditioning circuit 1128 provides the micro controller 1101 with the safety system input signal.

Several outputs are provided by the micro controller 1101, including a control signal for controlling the passenger's restraint 1132, a control signal for controlling the driver's restraint 1134, a system status lamp 1135 and a safety system output signal 1136. Each of these outputs are connected to their respective conditioning circuitry via a connector 1130.

The micro controller 1101 produces output signals for the control of the driver and passenger restraints, as well as a system status indicator and a safety system output. Each of these output signals are conditioned by internal ORCM output conditioning circuitry 1110, which includes a passenger high side protected output driver 1111; a passenger output sense feedback circuit 1112; a driver's high side protected output driver 1113; a driver's output sense feedback circuit 1114; a status lamp high side protected driver 1115; a status lamp output sense feedback circuit 1116; a safety system high side protected output driver 1117; and a safety system output sense feedback circuit 1118.

In sum, during normal operation of the invention, the micro controller 1101 receives the acceleration/tilt sense information from the sensor of this invention and depending on the status of the driver's and passenger's doors, belt usage and the passenger's seat position, the micro controller generates a signal to maintain or modify the tension on the driver's and/or the passenger's belt restraints.

It should be understood that the above described embodiments of the invention are to be considered in all respects only as illustrative and not restrictive. Although the embodiments described herein, show the current preferred embodiment of the invention known to the inventor, the invention is not limited thereto. The scope of this invention is indicated by the appended claims and the range of equivalency of the appended claims.

I claim:

1. A sensor system for use in combination with vehicle restraint devices, comprising:
    (A) a sensor housing comprising a base having a sloped top side, a cover having a sloped bottom side, a receptacle and a channel for communication;
    (B) a sensor mass contained within said sensor housing, said sensor mass resting on said sloped top side of said base, and said sloped bottom side of said cover resisting the upward motion of said sensor mass;
    (C) a detector in communication with said sensor mass, said receptacle adapted to receive said detector; and
    (D) a mount fixed to said sensor housing for mounting said sensor system to an electronics assembly.

2. A sensor system for use in combination with vehicle restraint devices, as recited in claim 1, wherein said sensor mass is composed of a polymer.

3. A sensor system for use in combination with vehicle restraint devices, as recited in claim 1, wherein said sensor mass is generally spherical.

4. A sensor system for use in combination with vehicle restraint devices, as recited in claim 1, wherein said sensor mass has a reflective surface.

5. A sensor system for use in combination with vehicle restraint devices, as recited in claim 1, wherein said sensor mass is composed of a ferro-magnetic material.

6. A sensor system for use in combination with vehicle restraint devices, as recited in claim 1, wherein said sensor housing further comprises an aperture for communicating optical energy from said detector to said sensor mass.

7. A sensor system for use in combination with vehicle restraint devices, as recited in claim 1, wherein said sensor housing further comprises an aperture for communicating optical energy from said sensor mass to said detector.

8. A sensor system for use in combination with vehicle restraint devices, as recited in claim 1, wherein said detector is adapted to transmit optical energy to said sensor mass and to receive optical energy from said sensor mass.

9. A vehicle restraint system comprising:
    a sensor system comprising a sensor housing adapted to be mounted in an electronic circuit, a sensor mass held within said sensor housing adapted to move to an infinite number of positions within said sensor housing responsive to an external force, a detector held within said sensor housing and in communication with said sensor mass for detecting said position of said sensor mass within said sensor housing, and an electronic communication channel;
    a vehicle restraint; and
    a control module receiving an input from said sensor system and communicating a control signal to said vehicle restraint.

10. A vehicle restraint system, as recited in claim 9, wherein said detector is an optical detector.

11. A vehicle restraint system, as recited in claim 10, wherein said sensor mass further comprises a polymer material.

12. A vehicle restraint system, as recited in claim 11, wherein said sensor mass further comprises a ferro-magnetic material.

13. A vehicle restraint system, as recited in claim 12, wherein said sensor mass is generally spherical in shape.

14. A vehicle restraint system, as recited in claim 13, wherein said sensor mass is generally optically reflective.

15. A vehicle restraint system, as recited in claim 14, wherein said sensor housing further comprises a cover and a base.

16. A vehicle restraint system, as recited in claim 15, wherein said base further has a generally concave top surface to permit said sensor mass to move in a plurality of directions in response to an external force.

17. A vehicle restraint system, as recited in claim 16, wherein said cover is attached to said base and wherein said cover has a generally convex bottom surface to restrain the upward motion of said sensor mass.

18. A vehicle restraint system, as recited in claim 17, wherein said sensor housing further comprises an aperture for communicating IR photo electric energy between said detector and said sensor mass.

19. A vehicle restraint system, as recited in claim 18, wherein said vehicle restraint is a belt and belt fastener device.

20. A vehicle restraint system, as recited in claim 19, wherein said control module further comprises:
   (1) a micro controller;
   (2) a means for receiving acceleration and tilt status of said vehicle from said sensor;
   (3) a means for receiving vehicle door status from said vehicle;
   (4) a means for receiving belt fastener status from said vehicle;
   (5) a means for displaying system status of said control module; and
   (6) a means for imposing control on said restraint device.

21. A vehicle acceleration and tilt sensor comprising:
   (A) a sensor mass held within a sensor housing such that said sensor mass is permitted to move to an infinite number of positions within said sensor housing when a force is exerted upon said sensor mass, wherein said sensor housing further comprises a generally upwardly sloped base having a nadir at a generally central point in said base, and a cover having a z-axis restriction;
   (B) a detector having a means for communicating said position of said sensor mass to an electronic control means; and
   (C) a means for communicating said sensor mass position to said detector.

* * * * *